United States Patent [19]

Gerner et al.

[11] Patent Number: 5,250,466
[45] Date of Patent: Oct. 5, 1993

[54] METHOD FOR MANUFACTURING OHMIC CONTACTS FOR COMPOUND SEMICONDUCTORS

[75] Inventors: Jochen Gerner, Wiesloch; Werner Schairer, Weinsberg, both of Fed. Rep. of Germany

[73] Assignee: Telefunken electronic GmbH, Heilbronn, Fed. Rep. of Germany

[21] Appl. No.: 866,861

[22] Filed: Apr. 10, 1992

[30] Foreign Application Priority Data

Apr. 29, 1991 [DE] Fed. Rep. of Germany ....... 4113969

[51] Int. Cl.⁵ ................ H01L 21/441; H01L 21/477
[52] U.S. Cl. ................................ 437/184; 437/196; 437/247
[58] Field of Search .................... 437/184, 196, 247

[56] References Cited

U.S. PATENT DOCUMENTS

| | | | |
|---|---|---|---|
| 4,248,675 | 2/1981 | Bozler et al. | 136/256 X |
| 4,628,338 | 12/1986 | Narkayama et al. | 357/15 |
| 4,757,030 | 7/1988 | Galvin et al. | 437/184 X |
| 4,895,811 | 1/1990 | Inoue | 437/41 |

OTHER PUBLICATIONS

Sanada et al, "Ohmic Contacts to p-GaAs with Au/Zn/Au Structure", Japanese Journal of Applied Physics, vol. 19, No. 8, Aug. 1980 pp. L491-L494.
Solid State Electronics, vol. 30, No. 12, pp. 1345-1349, 1987, "Ohmic Contacts on Selectively Doped AlInAs/GaInAs Heterostructures Using Ni, AuGe and Au", Kamada et al.
J. Appl. Phys. 59(8), Apr. 15th, 1986, pp. 2901-2904, "Effect of annealing process parameters on the properties of AuGe ohmic contacts to GaAs", Kulkarni et al. Appl. Phys. Lett. 48(15), Apr. 14, 1986, pp. 986-988, "Low-temperature annealed contacts to very thin GaAs epilayers", Patrick et al.
J. Vac. Sci. Technol. B, vol. 4, No. 3, May/Jun., 1986, pp. 762-768, "The effects of germanium concentration on the compound formation and morphology of gold-based contacts to gallium arsenide", Kim et al.
Patents Abstracts of Japan, E-113, May 26, 1979, vol. 3, No. 61.

*Primary Examiner*—John S. Maples
*Attorney, Agent, or Firm*—Spencer, Frank & Schneider

[57] ABSTRACT

A method for manufacturing ohmic contacts on an n-doped semiconductor layer of a III-V compound semiconductor wherein initially an AuGe layer is formed on the n-type III-V compound semiconductor, with the thickness of the AuGe layer being between 5 and 50 nm and the germanium concentration being less than 1% by weight. An Au layer with a thickness of between 200 and 600 nm is deposited on the AuGe layer. This layer sequence is now either tempered at a temperature of approx. 360°-390° C. for a period between 40 and 180 minutes, or undergoes rapid thermal annealing at a temperature between 430° C. and 480° C. for a period of 5-20 seconds. The metal semiconductor contact manufactured in accordance with the invention is free of inhomogeneities and has predominantly even boundary surfaces. Thanks to the low ohmic contact resistance and the high reflectivity for radiation in the near-infrared and visible wavelength ranges, the contact is particularly suitable as a full-surface rear contact for luminescent semiconductor diodes emitting infrared or visible light.

13 Claims, 6 Drawing Sheets

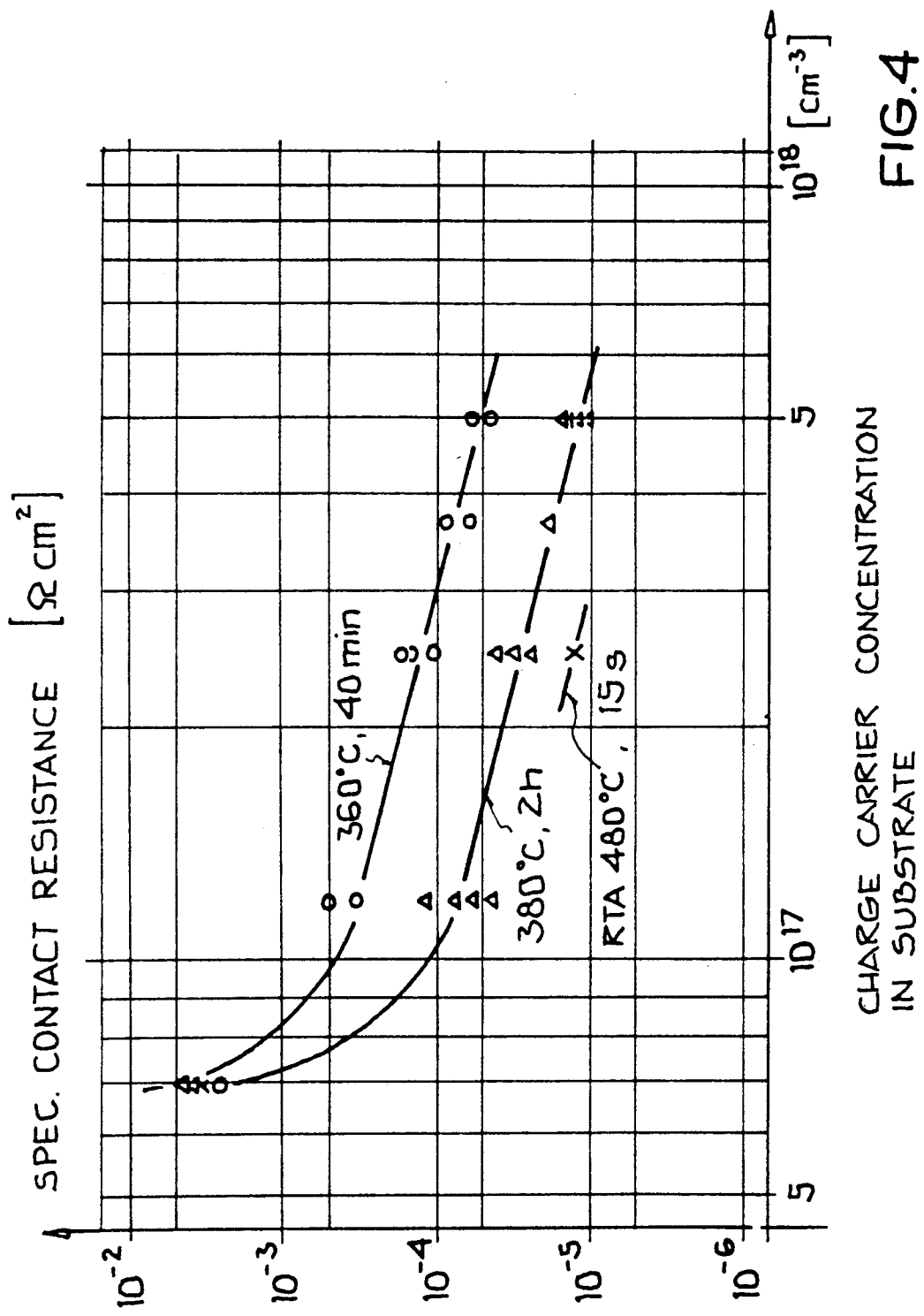

METHOD FOR MANUFACTURING OHMIC CONTACTS FOR COMPOUND SEMICONDUCTORS

FIELD OF THE INVENTION

The invention relates to a method for manufacturing ohmic contacts on an n-doped semiconductor layer of a III-V compound semiconductor.

BACKGROUND OF THE INVENTION

N-type compound semiconductor crystals, particularly GaAs, AlGaAs and GaP, are used on a large scale as substrate materials for luminescent semiconductor diodes emitting visible light or near-infrared light. The active light-generating field of the diodes is manufactured on the substrate material. The rear of the substrate is normally provided with an ohmic contact. Most known ohmic contacts for n-type III-V compound semiconductor crystals are made with the aid of a so-called alloy process. The procedure characteristic for alloying is the melting of a metal film onto the semiconductor surface. The metal film generally comprises—in the case of contacts on n-type III-V compound semiconductors—a eutectic AuGe or AuGeNi alloy. According to an explanation generally accepted today for the ohmic behavior of the alloyed contacts, part of the III-V compound semiconductor crystal is dissolved in the metal melt during the alloying process, in order to crystallize during cooling and to regrow epitaxially on the III-V compound semiconductor crystal. In the new layer thereby generated, there is sufficient germanium to dope the III-V compound semiconductor crystal as the n-type high enough for the field emission to dominate at the potential threshold between the contact metal and the semiconductor crystal. To achieve an ohmic behavior of the contacts as good as that observed in alloyed AuGe and AuGeNi contacts, a doping concentration of at least $5 \cdot 10^{19}$ cm$^{-3}$ is required. A typical drawback of the alloyed contacts is their inhomogeneity both in the lateral and in the vertical direction in relation to the semiconductor surface. The alloying process generally results in a rough and inhomogeneous boundary surface formed by a large number of differently sized droplike or microcrystalline elevations containing germanium.

Depending on the size of the energy gap between the conduction band and the valence band of the substrate material and on the energy of the radiation generated by the luminescent semiconductor diode, the substrate material is at least partly transparent for the radiation generated. The highly germanium-doped areas that result from the alloying process of the AuGe or AuGeNi contact on the rear of the substrate material however absorb the light hitting them and thereby cause considerable absorption losses. Both the quality and the reproducibility of an alloyed contact frequently remain unsatisfactory. This applies in particular for the electrical and optical properties and to the morphology of the alloyed contacts.

The object of the present invention is therefore to provide a method for manufacturing ohmic contacts on an n-doped semiconductor layer or a III-V compound semiconductor, with the contacts having a low contact resistance and a high reflectivity for radiation in the visible spectral and near-infrared ranges.

SUMMARY OF THE INVENTION

The object generally is attained by a method for manufacturing ohmic contacts on an n-doped semiconductor layer of a III-V compound semiconductor material including: depositing a first metal layer comprising AuGe on the semiconductor layer, where the Ge content of the first metal layer does not exceed 1% by weight; depositing a second metal layer comprising Au on the first metal layer; and tempering the layer sequence at 360°–390° C. for a duration of 40–180 minutes. Alternatively, the tempering process step may be replaced by a rapid thermal annealing process step at a temperature of 430°–480° C. and a duration of 5–20 seconds.

Since the method in accordance with the invention for manufacturing an ohmic contact involves a tempering process or alternatively an annealing process using rapid thermal annealing instead of the alloy process, liquefaction and recrystallization of the AuGe or AuGeNi film do not take place during manufacture of the contact. The contacts thus manufactured are therefore free of the inhomogeneities occurring in the alloy process, and also have predominantly even boundary surfaces between the metallized portion and the compound semiconductor crystal. The use of the reflecting ohmic rear contact in accordance with the invention in luminescent semiconductor diodes permits reduction of the contact absorption and an improvement in the optical efficiency.

The graph in FIG. 4 shows the dependence of the specific contact resistance of a contact in accordance with the invention on the substrate doping for various tempering processes.

Figure 5:
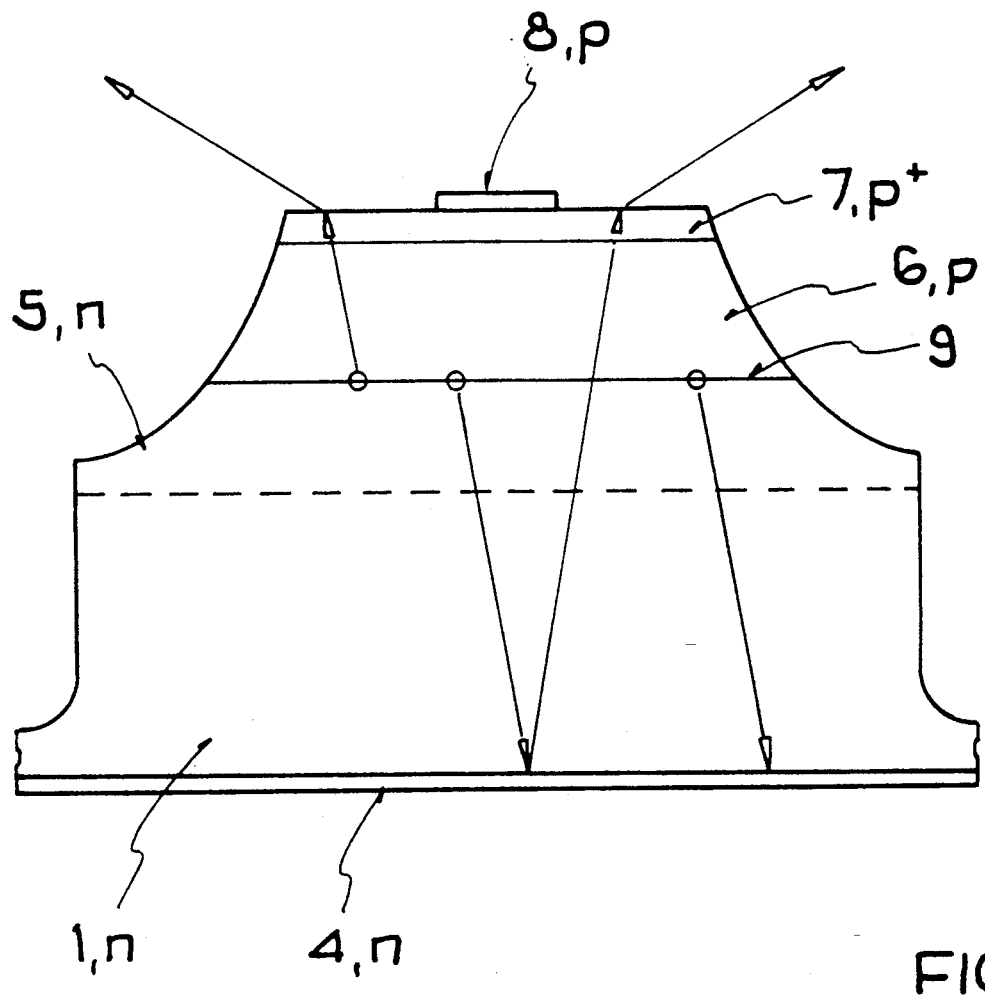

FIG. 5 shows a cross-section through a luminescent semiconductor diode with a rear contact in accordance with the invention.

Figure 6:
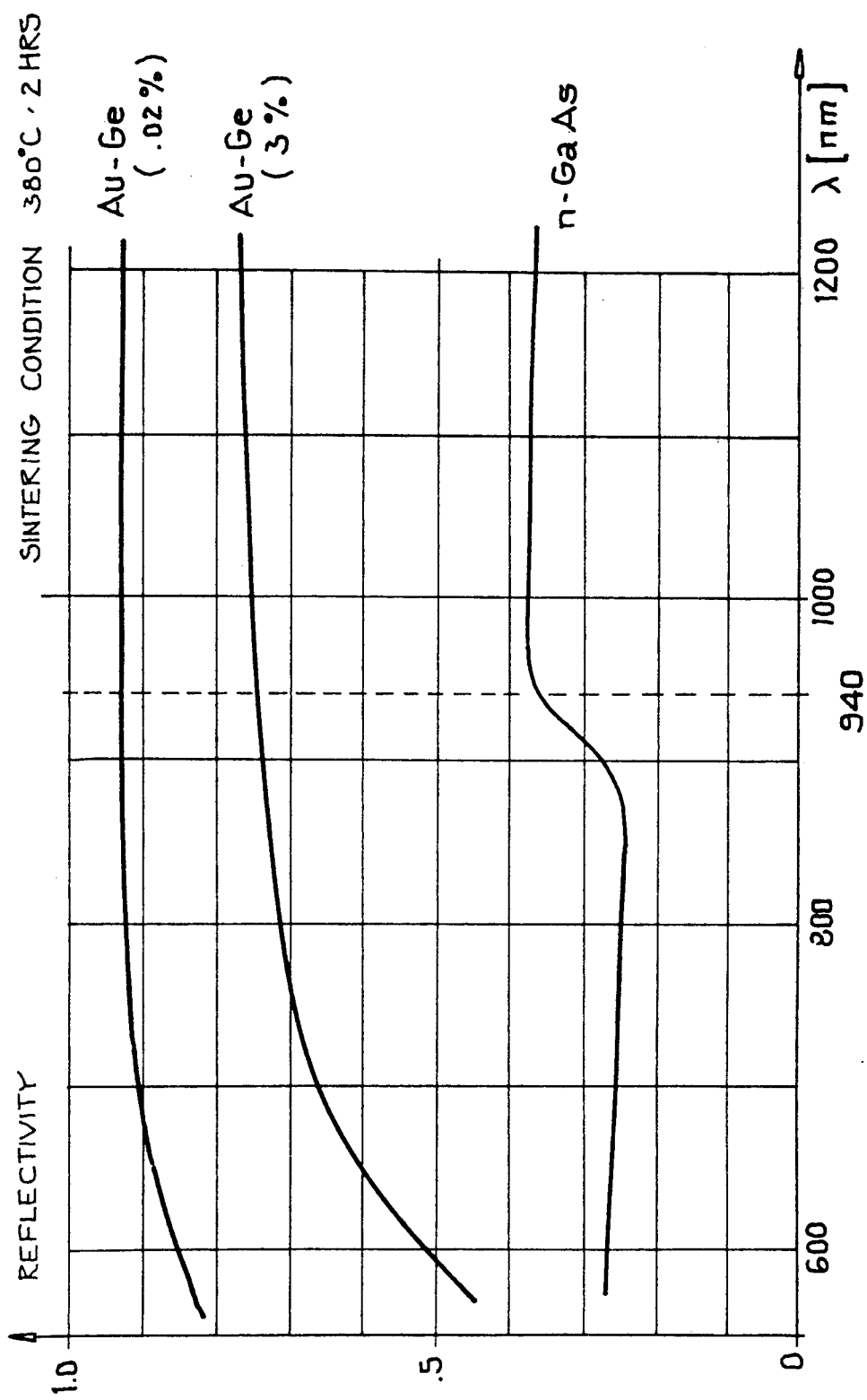

The graph in FIG. 6 shows the dependence of the reflectivity on the wavelength for GaAs and two different contact metals.

Figure 7:
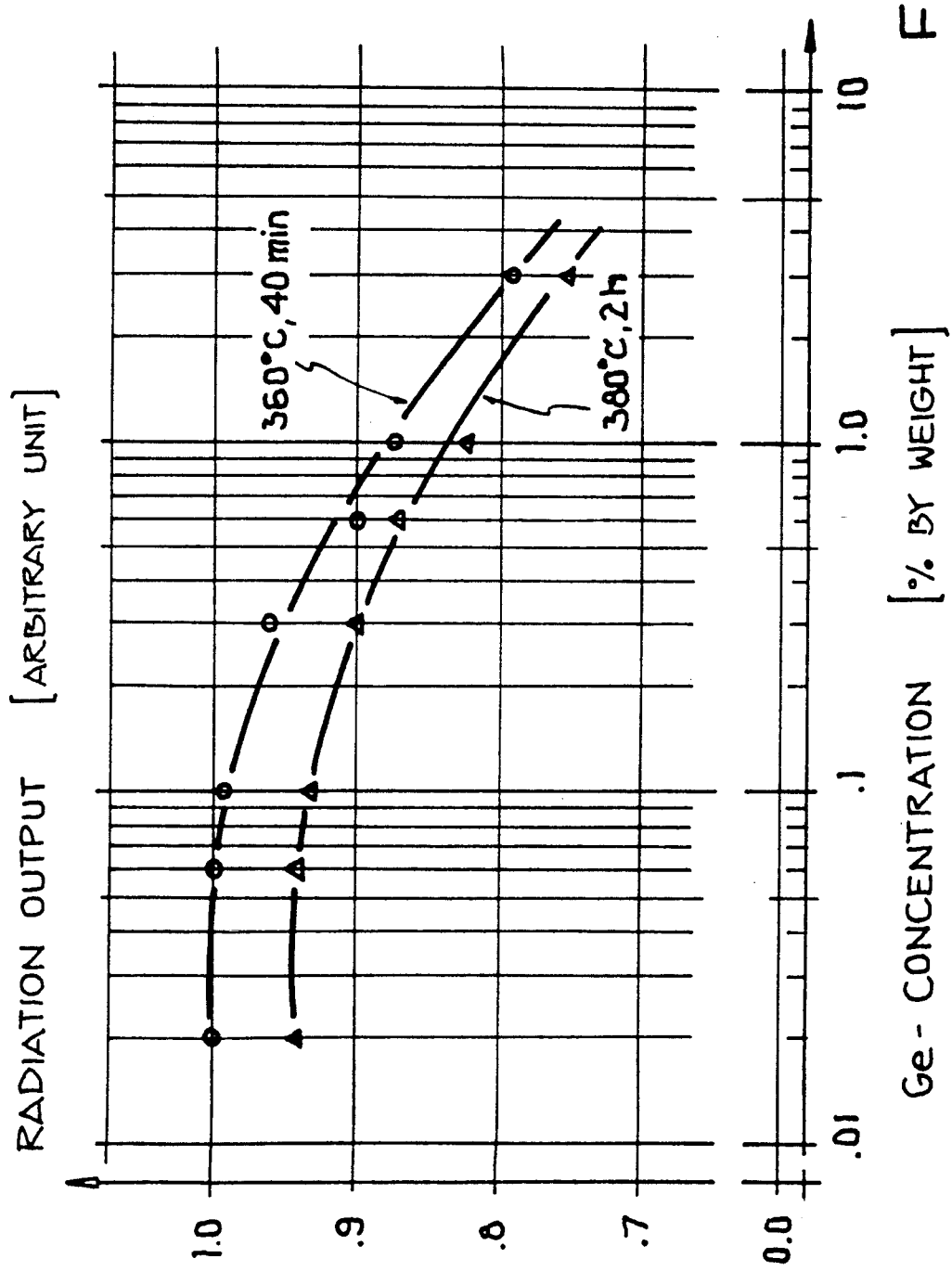

The graph in FIG. 7 shows the dependence of the optical power input of an infrared diode on the germanium concentration of the rear contact in accordance with the invention for two different tempering conditions.

DETAILED DESCRIPTION OF THE PREFERRED EMBODIMENTS

Figure 1:
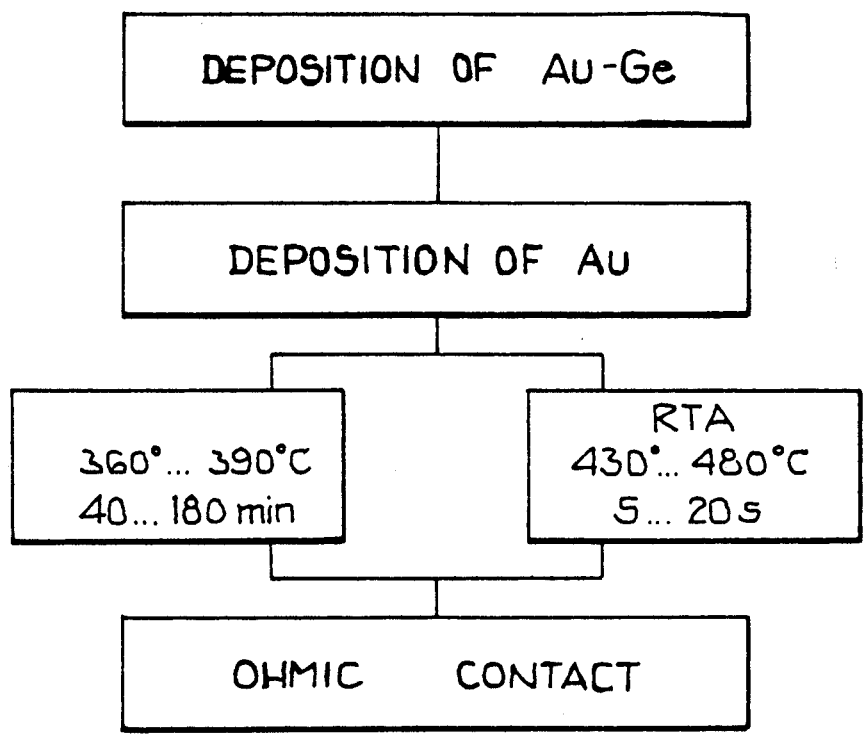
FIG. 1 shows a flow diagram of the method in accordance with the invention.

FIG. 1 shows a flow diagram of the method in accordance with the invention for the manufacture of reflecting ohmic contacts on an n-doped semiconductor layer of a III-V compound semiconductor.

Figure 2:
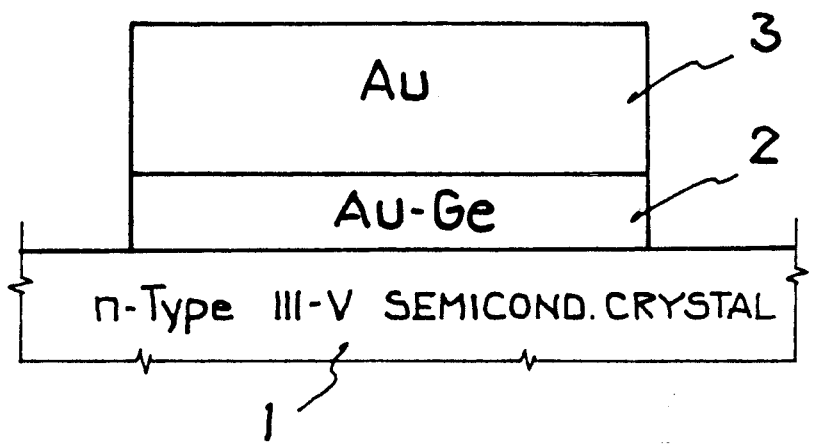
FIG. 2 shows a cross-section through the layer sequence of the contact prior to temperature treatment.
Figure 3A:
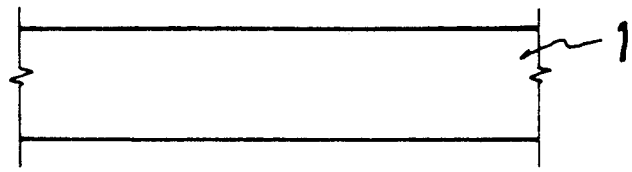
FIGS. 3a to 3d show the process steps for manufacture of an ohmic contact in accordance with the invention.
Figure 3B:
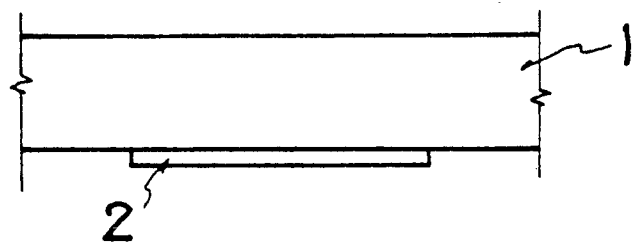
Figure 3C:
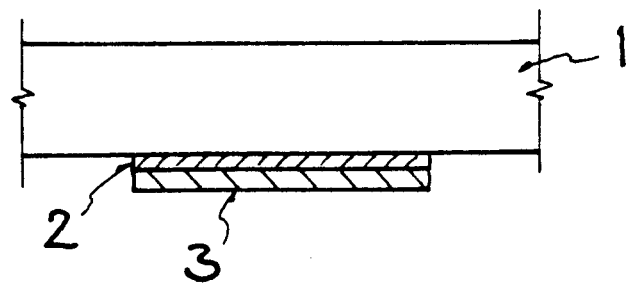
Figure 3D:
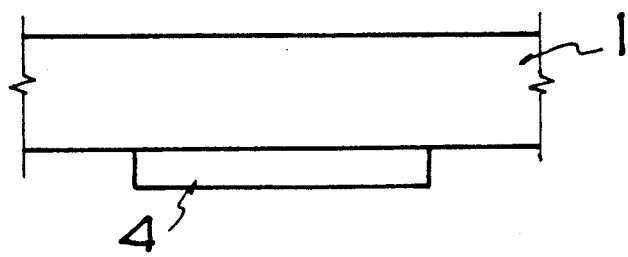

The method comprises one step each for the manufacture of a first and a second metal layer on the rear of an n-type III-V compound semiconductor crystal, and a tempering or annealing step to generate the ohmic contact. In the first step of the method, the AuGe layer 2 is formed on the III-V compound semiconductor crystal 1 by thermal evaporation from an AuGe source heated by an electron beam (FIG. 3b). In the second step of the method, the Au layer 3 is formed on the AuGe layer 2 using the same method (FIG. 3c). Vacuum deposition takes place at a pressure of approx. $2 \cdot 10^{-7}$ mbars. The acceleration voltage of the electron beam is 10 kV. FIG. 2 shows the layer sequence of the ohmic contact before the temperature treatment. The metal semiconductor contact comprises two layers, an AuGe layer 2 and an Au layer 3. The AuGe layer 2 is located directly on the n-type III-V compound semiconductor crystal 1 and has a thickness of between 5 and 50 nm. The germanium concentration in the AuGe layer 2 is typically 0.5% by weight and should not exceed 1% by weight, in order not to adversely affect the reflectivity of the contact layer. The Au layer 3 with a thickness between 200 and 600 nm is located on the AuGe layer 2.

In the now following tempering step, the AuGe and Au layers 2 and 3 formed in the previous process steps are tempered at a temperature between 360° C. and 390° C. in order to generate a homogeneous contact layer 4. The tempering time is between 40 minutes and 3 hours. Tempering is performed in an inert atmosphere of, for example, $N_2$ or Ar gas. The tempering process can however also be performed in a reducing atmosphere.

During the tempering process, the reflecting ohmic contact layer 4 is formed. The properties of the metal semiconductor contact layer are determined by the settings for the tempering time and the tempering temperature. A high reflectivity is achieved by a short tempering time and a low tempering temperature. A low contact resistance is, by contrast, achieved by a long tempering time and a high tempering temperature. In each individual case, therefore, how the parameters of the tempering process are set will depend on the properties required for the luminescent diode.

Alternatively to the tempering step, a brief annealing process is feasible, performed in a rapid thermal annealing unit. In this case, the annealing temperature is between 430° and 480° C. for a period of 5–20 seconds. The annealing process takes place in the inert atmosphere of an inactive gas such as $N_2$ or Ar. The ohmic contact is achieved by diffusion of the germanium atoms from the AuGe layer 2 into the surface of the n-type III-V compound semiconductor 1. Examples for n-type III-V compound semiconductors on which an ohmic contact is producible using the method in accordance with the invention are GaAs, AlGaAs, GaP, InP and related semiconductor crystals.

FIG. 4 shows the dependence of the specific contact resistance on the charge carrier concentration in the substrate. The substrate material is, in this example, 100-n-GaAs. The metal semiconductor contact comprises a 10 nm thick AuGe layer with 0.5% by weight germanium and a 240 nm thick Au layer. After completion of the tempering process, the tempered metal layer contains germanium in an average concentration of 0.02% by weight. A specific contact resistance of $1 \cdot 10^{-5}$ $\Omega cm^2$ with substrate doping of $5 \cdot 10^{17}$ $cm^{-3}$ is achieved by a tempering process lasting two hours at 380° C. A full-surface rear contact with a contact resistance of this order of magnitude no longer has any significant effect on the forward voltage of a normal luminescent semiconductor diode.

FIG. 5 shows a cross-section through a luminescent semiconductor diode with a rear contact 4 in accordance with the invention. This diode is a GaAs-mesa diode for the infrared spectral range. Possible light paths are shown symbolically by arrows. The infrared light is generated in a plane defined by the pn-junction 9. Part of the light leaves the luminescent diode on a direct path via the free areas of the chip surface. Another part of the light however hits the rear contact 4. An alloyed AuGe or AuGeNi contact absorbs the greater part of the radiation in the germanium-doped area of the rear surface. In the case of the rear contact manufactured in accordance with the invention, the greater part of the radiation is however reflected by the contact boundary surface of the substrate and can therefore exit at the chip surface. This results in an improvement in the optical power output.

FIG. 6 shows the dependence of the reflectivity on the wavelength for GaAs and for two different contact metals under the same tempering conditions. The upper curve applies for AuGe with 0.02% by weight germanium, the lower curve for AuGe with 3% by weight of germanium. For alloyed contacts, AuGe with 3% or 12% by weight of Ge is normally used. As the curve indicates, the reflectivity of the tempered AuGe contact rises as the germanium concentration falls and reaches the reflectivity of pure gold with germanium concentrations of less than 0.1% by weight.

FIG. 7 shows the optical power output of an infrared diode with a rear contact in accordance with the invention as a function of the germanium context of the tempered rear contact. The emission wavelength of the infrared diode is approx. 940 nm. The rear contact comprises a 10 nm thick AuGe layer with 0.5% by weight of Ge and a 240 nm thick Au layer above it. The maximum radiation output is achieved with a Ge concentration of 0.1% by weight, a tempering temperature of 360°0 C. and a tempering time of 40 minutes. A slightly higher tempering temperature of approx. 380° C. in conjunction with a longer tempering time of two hours leads to a lowering of the radiation output by approx. 6%.

Due to the low ohmic contact resistance and the high reflectivity for radiation in the near-infrared and visible wavelength range, the contact is particularly suitable as a full-surface rear contact for luminescent semiconductor diodes emitting infrared or visible light.

What is claimed is:

1. A method for manufacturing ohmic contacts on an n-doped semiconductor layer of III-V compound semiconductor material comprising the following process steps:

depositing a first metal layer comprising AuGe on said semiconductor layer, wherein the Ge content of said first metal layer does not exceed 1% by weight, depositing a second metal layer comprising Au on said first metal layer, and tempering the layer sequence at 360°–390° C. for a duration of 40–180 minutes.

2. A method according to claim 1, wherein the germanium content averaged over said two metal layers is 0.02–0.1% by weight.

3. A method according to claim 2, wherein said first metal layer has a thickness in the range 5–50 nm and wherein said second metal layer has a thickness in the range 200–600 nm.

4. A method according to claim 1, wherein the tempering step takes place in an inert atmosphere.

5. A method according to claim 1, wherein said tempering takes place in a reducing atmosphere.

6. A method according to claim 1, wherein said III-V compound semiconductor material is GaAs of n-conductivity type with 100 or 111 orientation.

7. A method according to claim 6, wherein said first metal layer contains 0.5% by weight germanium and is 10 nm thick, and wherein said second metal layer is 240 nm thick.

8. A method according to claim 7, wherein the layer sequence is tempered for approx. 120 minutes at a temperature of approx. 380° C.

9. A method for manufacturing ohmic contacts on an n-doped semiconductor layer of III-V compound semiconductor material, comprising the following process steps:
   depositing a first metal layer comprising AuGe on said semiconductor layer, where the Ge content of said first metal layer does not exceed 1% by weight;
   depositing a second metal layer comprising Au on said first metal layer; and
   rapid thermal annealing the layer sequence at a temperature of 430°–480° C. and a duration of 5–20 seconds.

10. A method according to claim 9 wherein the germanium content averaged over said two metal layers is 0.02–0.1% by weight.

11. A method according to claim 10 wherein said first metal layer has a thickness in the range 5–50 nm and wherein said second metal layer has a thickness in the range 200–600 nm.

12. A method according to claim 9 wherein the rapid thermal annealing step takes place in an inert atmosphere.

13. A method according to claim 9 wherein said III-V compound semiconductor material is GaAs of n-conductivity type with 100 or 111 orientation.

* * * * *